(12) United States Patent
Kay

(10) Patent No.: US 12,074,628 B2
(45) Date of Patent: *Aug. 27, 2024

(54) PACKAGED ELECTRICAL DEVICE

(71) Applicant: SKYWORKS SOLUTIONS, INC., Irvine, CA (US)

(72) Inventor: Andrew Martin Kay, Lake Forest, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/127,598

(22) Filed: Mar. 28, 2023

(65) Prior Publication Data

US 2023/0387957 A1 Nov. 30, 2023

Related U.S. Application Data

(63) Continuation of application No. 16/139,163, filed on Sep. 24, 2018, now Pat. No. 11,616,526, which is a (Continued)

(51) Int. Cl.
*H04B 1/40* (2015.01)
*H01C 1/148* (2006.01)
(Continued)

(52) U.S. Cl.
CPC ............... *H04B 1/40* (2013.01); *H01C 1/148* (2013.01); *H01G 2/065* (2013.01); *H01G 4/012* (2013.01); *H01G 4/232* (2013.01); *H01G 4/30* (2013.01); *H01F 17/0013* (2013.01); *H01L 23/66* (2013.01); *H01L 2223/6655* (2013.01); *H01L 2223/6677* (2013.01); *H01L 2924/0002* (2013.01); *H01L 2924/141* (2013.01);
(Continued)

(58) Field of Classification Search
CPC .......... H04B 1/40; H04B 1/38; H04B 1/3833; H01C 1/148; H01G 2/065; H01G 4/012; H01G 4/232; H01G 4/30; H01F 17/0013; H01L 23/66; H01L 2223/6655; H01L 2223/6677; H01L 2924/0002; H01L 2924/141; H01L 2924/1421; H01L 2924/19041; H01L 2924/19042; H01L 2924/19043; H01L 2924/19105; H01L 23/13; H01L 23/49838; H01L 25/00
See application file for complete search history.

(56) References Cited

U.S. PATENT DOCUMENTS

| | | | | |
|---|---|---|---|---|
| 5,339,218 A | * | 8/1994 | Veeck | H01L 2924/0002 361/767 |
| 6,410,363 B1 | * | 6/2002 | Tani | H01L 2924/19043 257/E23.044 |
| 10,084,503 B2 | * | 9/2018 | Kay | H04B 1/40 |
| 11,616,526 B2 | * | 3/2023 | Kay | H04B 1/40 455/73 |

(Continued)

*Primary Examiner* — Lana N Le
(74) *Attorney, Agent, or Firm* — Chang & Hale LLP

(57) ABSTRACT

A packaged electrical device can include an electrical element and a plurality of terminals connected to the electrical element. The packaged electrical device can further include a body configured to support the electrical element and the plurality of terminals. The body can have a rectangular cuboid shape with a length, a width, and a height that is greater than the width. The body can include a base plane configured to allow surface mounting of the device.

3 Claims, 8 Drawing Sheets

Related U.S. Application Data continuation of application No. 14/883,472, filed on Oct. 14, 2015, now Pat. No. 10,084,503.

(60) Provisional application No. 62/064,435, filed on Oct. 15, 2014.

(51) Int. Cl.
*H01G 2/06* (2006.01)
*H01G 4/012* (2006.01)
*H01G 4/232* (2006.01)
*H01G 4/30* (2006.01)
*H01L 23/66* (2006.01)
*H01F 17/00* (2006.01)

(52) U.S. Cl.
CPC ............. *H01L 2924/1421* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | | |
|---|---|---|---|---|
| 2007/0252254 A1* | 11/2007 | Chiu | ............... | H01L 23/66 |
| | | | | 257/E23.194 |
| 2014/0240195 A1* | 8/2014 | Shiu | ............... | H01B 1/40 |
| | | | | 343/893 |
| 2021/0242099 A1* | 8/2021 | Takeshita | ............... | H01L 23/13 |
| 2022/0208701 A1* | 6/2022 | Koduri | ............... | H01L 23/66 |
| 2023/0217593 A1* | 7/2023 | Nam | ............... | H01L 23/49838 |
| | | | | 361/761 |

* cited by examiner

PACKAGED ELECTRICAL DEVICE

CROSS-REFERENCE TO RELATED APPLICATION(S)

This application is a continuation of U.S. application Ser. No. 16/139,163 filed Sep. 24, 2018, entitled SURFACE-MOUNTABLE DEVICE, which is a continuation of U.S. application Ser. No. 14/883,472 filed Oct. 14, 2015, entitled SURFACE-MOUNT TECHNOLOGY DEVICES AND RELATED METHODS, which claims priority to and the benefit of the filing date of U.S. Provisional Application No. 62/064,435 filed Oct. 15, 2014, entitled SMT DEVICES, the benefits of the filing dates of which are hereby claimed and the disclosures of which are hereby expressly incorporated by reference herein in their entirety.

BACKGROUND

Field

The present disclosure relates to surface-mount technology (SMT) devices.

Description of the Related Art

In many electronic applications, electronic circuits such as radio-frequency (RF) circuits are implemented such that the components are mounted on the surface of a substrate such as a packaging substrate or a circuit board. Such components are commonly referred to as surface-mount technology (SMT) devices, or as surface-mount devices (SMDs).

SUMMARY

According to a number of teachings, the present disclosure relates to a surface-mount technology (SMT) device that includes an electrical element and a plurality of terminals connected to the electrical element. The SMT device further includes a body configured to support the electrical element and the plurality of terminals. The body has a rectangular cuboid shape with a length, a width, and a height that is greater than the width. The body includes a base plane configured to allow surface mounting of the SMT device.

In some embodiments, the body can include a plurality of layers. In some embodiments, the electrical element can include a capacitance element such that the SMT device is a capacitor. The capacitance element can include a first set of conductive plates and a second set of conductive plates formed on the respective layers. The first and second sets of conductive plates can be arranged in an interleaved configuration, and the first set of conductive plates can be electrically connected to a first terminal and the second set of conductive plates can be electrically connected to a second terminal.

In some embodiments, the first and second sets of conductive plates can be approximately parallel to the base plane. The height of the body being greater than the width can allow implementation of at least one of thicker dielectric layers between the conductive plates, increased number of conductive plates, and thicker conductive plates. The thicker dielectric layers can result in an increased breakdown voltage of the capacitor. The increased number of conductive plates can result in an increased capacitance of the capacitor. The thicker conductive plates can result in an increased quality factor value Q.

In some embodiments, the first and second sets of conductive plates can be approximately perpendicular to the base plane. The height of the body being greater than the width can allow implementation of conductive plates having larger areas. The larger areas of the conductive plates can result in an increased capacitance of the capacitor. The larger areas of the conductive plates can result in an increased yield in formation of the conductive plates.

In some embodiments, the plurality of terminals can include first and second L-shaped terminals, with each L-shaped terminal having a conductive pad on the base plane and a conductive wall on an end wall electrically connected to the conductive pad to form an L shape. The conductive wall of the first L-shaped terminal can be electrically connected to the first set of conductive plates, and the conductive wall of the second L-shaped terminal can be electrically connected to the second set of conductive plates.

In some embodiments, the electrical element can include an inductance element such that the SMT device is an inductor having a winding. The inductance element can include a plurality of conductive traces formed on the respective layers such that a first end of the winding is electrically connected to a first terminal and a second end of the winding is electrically connected to a second terminal.

In some embodiments, the conductive traces can be approximately parallel to the base plane. The height of the body being greater than the width can allow implementation of at least one of increased number of turns of the conductive traces, increased thickness of the conductive traces, and increased separation of the winding from the base plane. The increased number of turns of the conductive traces can result in an increased inductance of the inductor. The increased thickness of the conductive traces can result in either or both of an increased current handling capacity and an increased quality factor value Q. The increased separation of the winding from the base plane can result in an increased quality factor value Q.

In some embodiments, the conductive traces can be approximately perpendicular to the base plane. The height of the body being greater than the width can allow the turns of the conductive traces to have an increased diameter. The increased diameter of the turns of the conductive traces can result in an increased quality factor value Q.

In some embodiments, the plurality of terminals can include first and second L-shaped terminals, with each L-shaped terminal having a conductive pad on the base plane and a conductive wall on an end wall electrically connected to the conductive pad to form an L shape. The conductive wall of the first L-shaped terminal can be electrically connected to the first end of the windings, and the conductive wall of the second L-shaped terminal can be electrically connected to the second end of the windings. The L-shaped terminals can result in a decreased parasitic capacitance to the winding.

In some embodiments, the electrical element can include a resistive element such that the SMT device is a resistor. The resistive element can be implemented on one surface of the body. The resistive element can be implemented on the mounting side of the body. The height of the body being greater than the width can allow the resistor to be fabricated with a higher yield when processed as a panel.

In some embodiments, the electrical element can include a passive circuit such that the SMT device is a passive component. The height of the body being greater than the width can allow the passive circuit to be positioned at an increased distance from the base plane.

In some embodiments, the length can have a value of approximately 250 μm. The width can have a value of approximately 125 μm. The height can have a value that is greater than 125 μm, 130 μm, 150 μm, or 200 μm.

In some implementations, the present disclosure relates to an electronic module that includes a packaging substrate configured to receive a plurality of components, and a semiconductor die mounted on the packaging substrate. The semiconductor die includes an integrated circuit. The electronic module further includes one or more surface-mount technology (SMT) devices mounted on the packaging substrate. Each SMT device includes an electrical element and a plurality of terminals connected to the electrical element. The SMT device further includes a body configured to support the electrical element and the plurality of terminals. The body has a rectangular cuboid shape with a length, a width, and a height that is greater than the width.

In some embodiments, the integrated circuit can be configured to provide radio-frequency (RF) functionality.

According to a number of implementations, the present disclosure relates to a wireless device that includes a transceiver configured to generate a radio-frequency (RF) signal, and an RF module in communication with the transceiver and configured to process the RF signal. The RF module includes a packaging substrate configured to receive a plurality of components, and a semiconductor die mounted on the packaging substrate. The semiconductor die includes an integrated circuit. The RF module further includes one or more surface-mount technology (SMT) devices mounted on the packaging substrate, with each SMT device including an electrical element and a plurality of terminals connected to the electrical element. The SMT device further includes a body configured to support the electrical element and the plurality of terminals. The body has a rectangular cuboid shape with a length, a width, and a height that is greater than the width. The wireless device further includes an antenna in communication with the RF module. The antenna is configured to facilitate transmission of the processed RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

As wireless devices such as smart phones become more complex and capable while maintaining certain device sizes, it is desirable to have components of a given wireless device to become smaller. For example, it is desirable to have radio-frequency (RF) modules such as power amplifier (PA) modules, PA-duplexer (PAD) modules, front-end (FE) modules, switching modules, low-noise amplifier (LNA) modules, diversity receive (DRx) modules, etc., be smaller while maintaining certain performance levels. In such a module, there can be as many as about 70 surface-mount technology (SMT) devices that facilitate various functionalities associated with the module. Accordingly, reducing the footprint areas of some or all of such SMT devices can reduce the overall area of the module.

Figure 1:
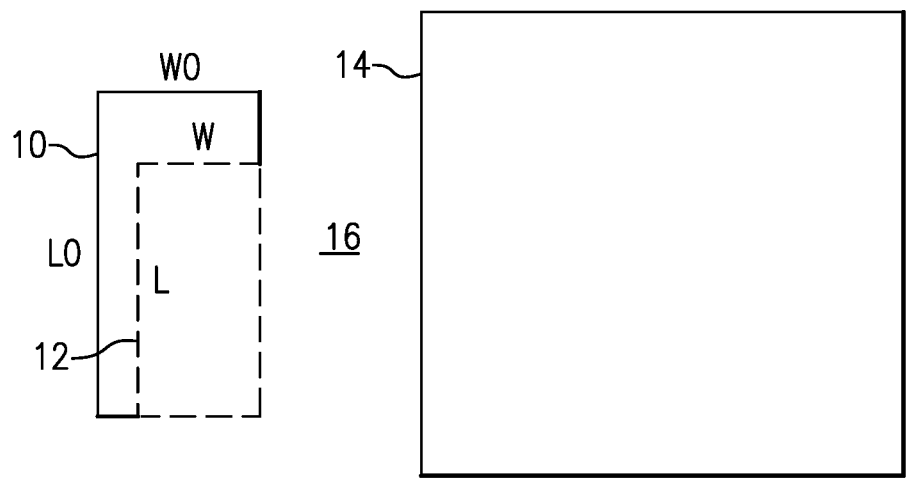
FIG. 1 shows plan view of an example surface-mount technology (SMT) device mounted on a packaging substrate.

FIG. 1 shows a plan view of an example SMT device 10 mounted on a packaging substrate 16. Such a packaging substrate can be configured to receive a plurality of components, including the SMT device 10 and a semiconductor die 14 having an RF integrated circuit. The SMT device 10 is shown to have lateral dimensions of L0 (length) and W0 (width).

In the example of FIG. 1, a reduced-sized SMT device 12 can replace the SMT device 10. The reduced-sized SMT device 12 is shown to have lateral dimensions of L (length) and W (width). Accordingly, a reduction in footprint area of approximately L0×W0—L×W can be realized with use of the example SMT device 12; and some or all of such a footprint-reduction can contribute to the overall reduction in area needed to implement a plurality of SMTs on a given packaging substrate.

Figure 2:
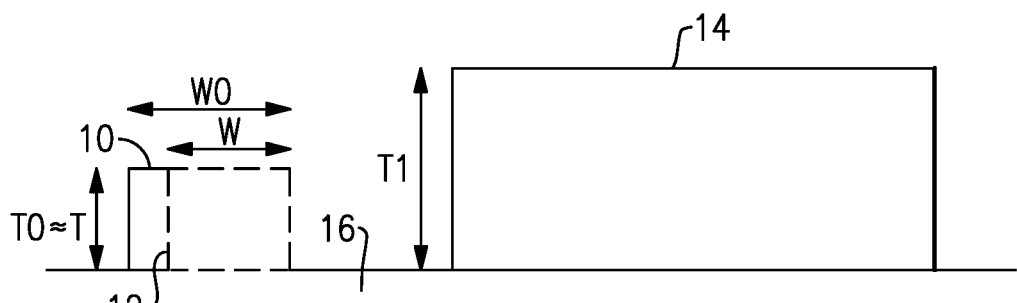
FIG. 2 shows a side view of the example of FIG. 1, where the height T of a reduced-sized SMT device can remain approximately the same as the height T0 of a larger-sized SMT device.

FIG. 2 shows a side view of the example of FIG. 1, where the height T of the reduced-sized SMT device 12 can remain approximately the same as the height T0 of the SMT device 10. In such a reduction configuration, performance can be sacrificed, and/or cost can be increased. For example, capacitors and inductors implemented as such reduced-sized SMT devices can suffer from decrease in quality factor (Q).

In the example of FIG. 2, it is noted that the semiconductor die 14 or some other component can have a height T1 that is significantly greater than the heights of the SMT devices 10, 12. In some embodiments, an SMT device can be configured to include a reduced footprint for reduction in lateral dimensions, and an increased height to address performance issues such as those associated with Q values (e.g., reduction in Q). In some embodiments, such an increased height can be implemented without increasing the overall height of the module. For example, the increased height of the SMT device can be less than or equal to the highest height of the various components implemented on the packaging substrate. If such a component having the highest height is the example semiconductor die 14, the increased height of the SMT device can be less than or equal to the height (T1) of the die 14.

Figure 3:
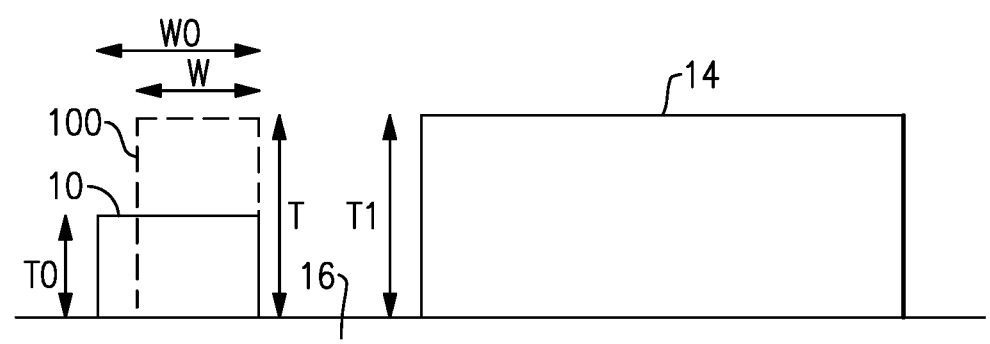
FIG. 3 shows an example configuration where an SMT device having a reduced footprint size can have an increased height T.

FIG. 3 shows an example configuration where an SMT device 100 having a reduced footprint size (e.g., L by W) also has an increased height T. In FIG. 3, the SMT device 10 and the semiconductor die 14 are generally the same as in the example of FIG. 2. In some embodiments, the height T of the SMT device 100 can be greater than its width W. Examples of dimensions associated with the SMT device 100, as well as different configurations that can be implemented, are described herein in greater detail.

Figure 4:
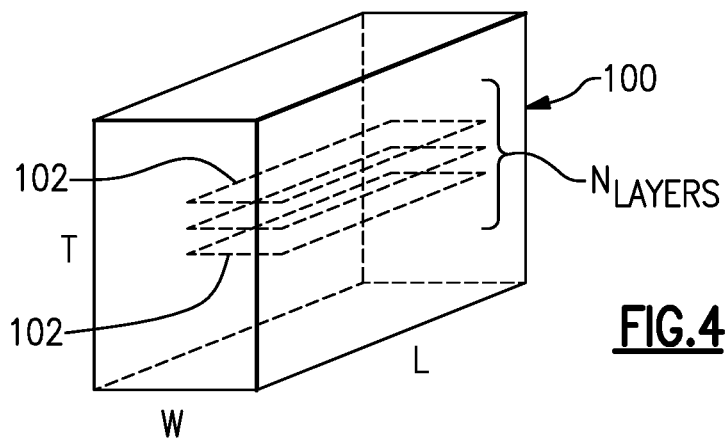
FIG. 4 shows that in some embodiments, the increased height T of the SMT device of FIG. 3 can allow more layers of features to be implemented, where the layers of features can be approximately parallel to the horizontal plane.
Figure 5:
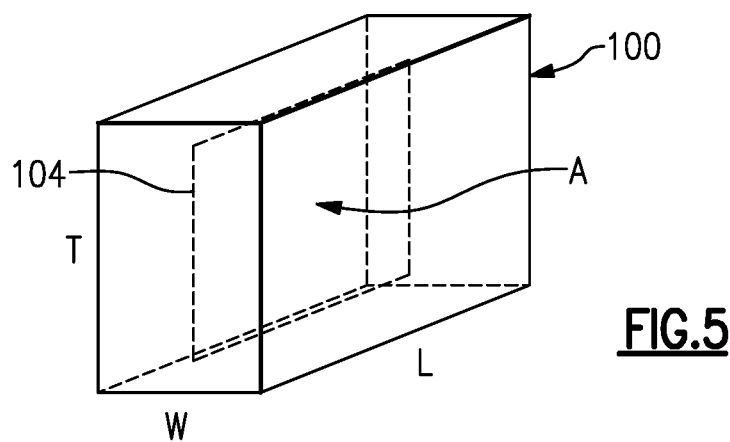
FIG. 5 shows that in some embodiments, one or more electrical elements associated with an SMT device can be oriented to be approximately perpendicular to the horizontal plane.
Figure 6:
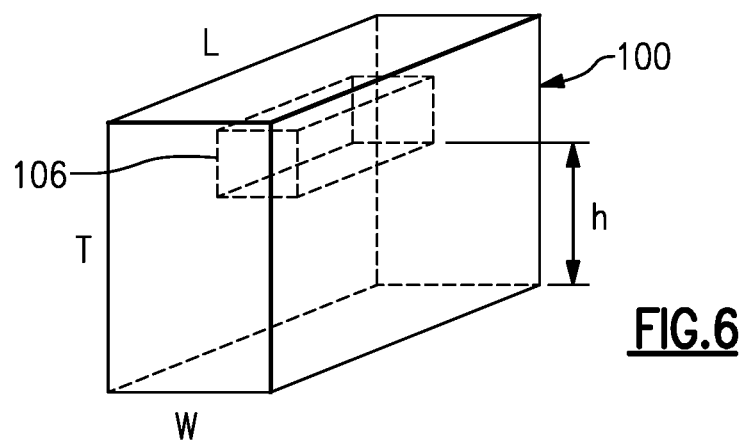
FIG. 6 shows that in some embodiments, the increased height T of the SMT device can provide increased flexibility in the placement of one or more electrical elements within the SMT device.

FIGS. 4-6 show perspective views of SMT devices 100, each having an increased height, and having different example configurations. Each SMT device 100 is generally depicted as a rectangular cuboid, in which all angles are approximately right angles and opposite faces are approximately equal. Each rectangular cuboid is shown to have a length of L, a width of W, and a height of T. Although described in the context of such a shape, it will be understood that one or more features of the present disclosure can also be implemented in other shapes. For the purpose of description, a plane defined by L and W can be referred to as a base plane, a mounting plane, a horizontal plane, or some combination thereof.

FIG. 4 shows that the increased height T of the SMT device 100 can allow more layers of features 102 to be implemented (e.g., when compared to an SMT device having a height that is less than its width), where the layers of features 102 are approximately parallel to the horizontal plane. In the example of FIG. 4, $N_{layers}$ of such layers of features can be implemented, and such an increased value of $N_{layers}$ can allow performance of the SMT device 100 to be maintained or improved even if its lateral dimensions are reduced. Examples of such an SMT device in the context of capacitors and inductors are described herein in greater detail.

FIG. 5 shows that in some embodiments, one or more electrical elements associated with an SMT device 100 can be oriented to be approximately perpendicular to the horizontal plane. For example, the increased height T of the SMT device 100 can allow an electrical element 104 to be implemented generally in a plane that is approximately perpendicular to the horizontal plane and approximately parallel to a plane defined by L and T. In such an orientation, the increased height T can allow the electrical element 104 to have a relatively large area (A) (e.g., when compared to an SMT device having a height that is less than its width), and such an increased value of A can allow performance of the SMT device 100 to be maintained or improved even if its lateral dimensions are reduced. Examples of such an SMT device in the context of capacitors and inductors are described herein in greater detail.

In the examples of FIGS. 4 and 5, the increased height T of the SMT device 100 provides increased flexibility in how the electrical elements can be configured and oriented. FIG. 6 shows that the increased height T of the SMT device 100 can also provide increased flexibility in the placement of one or more electrical elements within the SMT 100. For example, it may be desirable to position an electrical element 106 further away from the surface of the packaging substrate to, for example, reduce parasitic effects between the electrical element 106 and one or more conductive planes associated with the packaging substrate. In such an example situation, the electrical element 106 can be positioned further away from the packaging substrate (e.g., when compared to an SMT device having a height that is less than its width) due to the increased height of the SMT 100. For example, the electrical element 106 can be positioned at a height of h from the base of the SMT device 100. In some embodiments, the electrical element 106 can be, for example, a capacitance element or an inductance element.

Figure 7A:
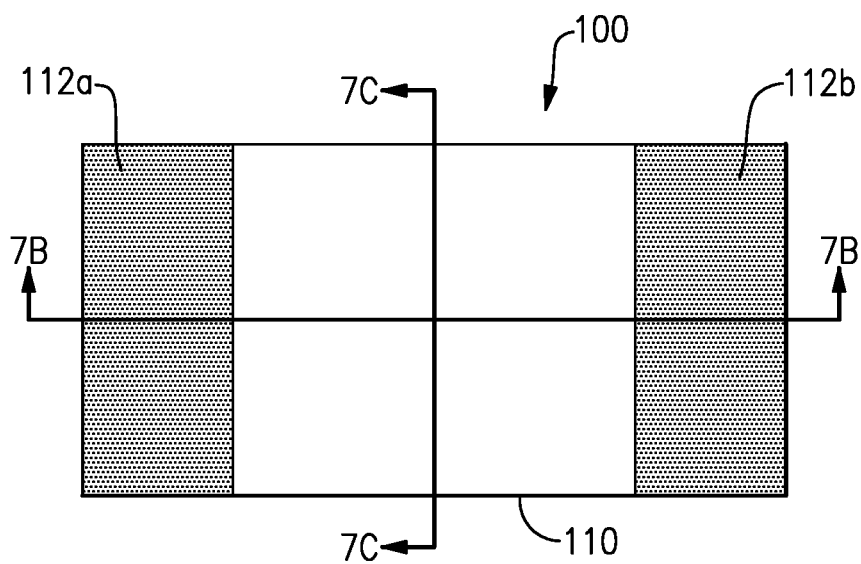
FIGS. 7A-7C show various views of a capacitor implemented as an SMT device, in which a plurality of parallel plates are arranged to be approximately parallel to the horizontal plane.
Figure 7B:
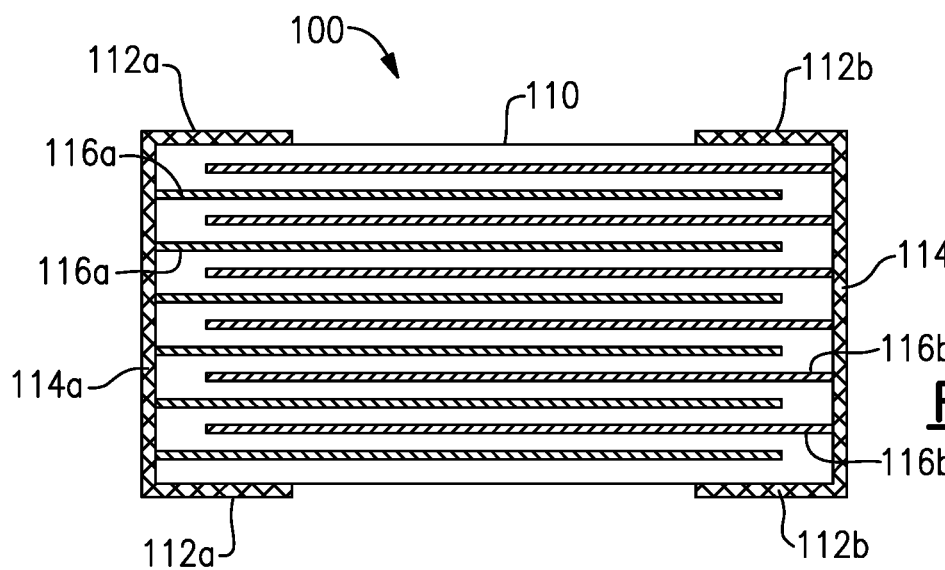
Figure 7C:
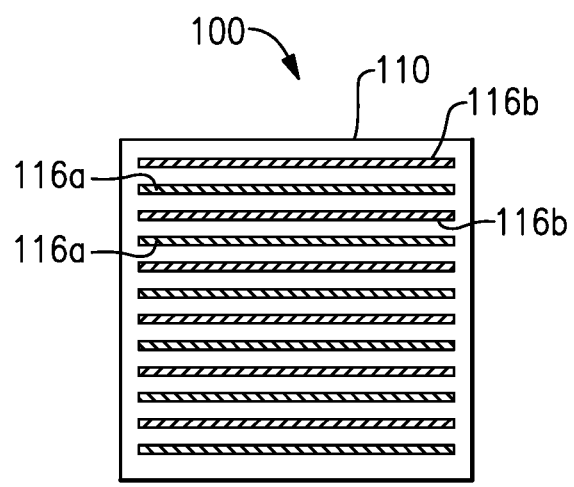

FIGS. 7A-7C show various views of a capacitor implemented as an SMT device 100, in which a plurality of parallel plates are arranged to be approximately parallel to the horizontal plane (e.g., similar to the example of FIG. 4). FIG. 7A shows a plan view, and FIGS. 7B and 7C show side sectional views as indicated.

The capacitor 100 of FIGS. 7A-7C is shown to include a first set of conductive layers 116a interleaved with a second set of conductive layers 116b so as to form an interleaved-plate capacitor configuration. The first set of conductive layers 116a are shown to be implemented within a body 110 of the capacitor 100 and electrically connected to a first conductive wall 114a (e.g., on the left side when viewed as in FIG. 7B). Similarly, the second set of conductive layers 116b are shown to be implemented within the body 110 of the capacitor 100 and electrically connected to a second conductive wall 114b (e.g., on the right side when viewed as in FIG. 7B). Although described in the context of the interleaved configuration having alternating layers (e.g., first conductive layer, second conductive layer, first conductive layer, etc.), it will be understood that the first and second sets of conductive layers can be arranged in other manners. For example, alternating groups of two first conductive layers and two second conductive layers can be implemented. In another example, one or more dummy or floating conductive layers can be provided between first and second conductive layers.

In the example of FIGS. 7A-7C, the first conductive wall 114a is shown to be electrically connected to first terminals 112a on upper and lower surfaces of the body 110. Similarly, the second conductive wall 114b is shown to be electrically connected to second terminals 112b on upper and lower surfaces of the body 110. Such terminals on the upper and lower sides of the body 110 can allow the capacitor 100 to be mounted upright or in an inverted orientation. In some embodiments, the foregoing terminals can be implemented only on one side, and such a side of the capacitor can be the mounting side.

In the example of FIGS. 7A-7C, the first and second sets of conductive layers 116a, 116b can be formed on a plurality of respective substrate layers. Such formation of conductive layers can be achieved by, for example, printing or other patterning/deposition techniques. In some embodiments, such conductive layers can be formed on the respective substrate layers in an array format (e.g., in a panel), and once the overall layer structure is obtained, individual units can be obtained by, for example, singulation. In some embodiments, the terminals 112a, 112b can be formed while in the panel format, after singulation, or in any combination thereof. In some embodiments, the first and second conductive walls 114a, 114b can be formed after the singulation process.

In the example of FIGS. 7A-7C, the capacitor 100 can implemented as an SMT device having a reduced footprint size and an increased height as described herein. For example, the capacitor 100 can be implemented in a sub-01005 SMT package size having approximate dimensions of L=250±13 μm, W=125±13 μm, and T=210±10 μm. The first and second terminals 112a, 112b on a given side can be dimensioned such that their inward edges are separated from each other by a distance of approximately 120 μm or greater.

As described herein, the increased height of the capacitor 100 can provide increased flexibility in design, including designs related to performance such as Q (quality factor or Q factor) values. For example, the increased height can allow the capacitor 100 of FIGS. 7A-7C to be implemented with one or more of the following: (1) thicker dielectric layers for higher voltage handling capability, (2) greater number of layers of interleaved plates for higher capacitance value, and (3) thicker plates for higher Q values. Table 1 lists some examples of capacitance and Q values (e.g., at a frequency of 1 GHz) that can be obtained or expected from the capacitor 100 of FIGS. 7A-7C having the foregoing example SMT dimensions.

TABLE 1

| Approximate capacitance value (pF) | Approximate Q value (minimum) |
|---|---|
| 1 | 391 |
| 1.1 | 380 |
| 1.2 | 370 |
| 1.3 | 361 |
| 1.5 | 346 |
| 1.6 | 340 |
| 1.8 | 328 |
| 2 | 317 |
| 2.2 | 308 |
| 2.4 | 300 |
| 2.7 | 289 |
| 3 | 279 |
| 3.3 | 271 |
| 3.6 | 263 |
| 3.9 | 256 |
| 4.3 | 247 |
| 4.7 | 239 |
| 5.1 | 231 |
| 5.6 | 223 |
| 6.2 | 214 |
| 6.8 | 205 |
| 7.5 | 196 |
| 8.2 | 188 |
| 9.1 | 178 |
| 10 | 169 |
| 11 | 160 |
| 12 | 152 |
| 13 | 145 |
| 15 | 131 |
| 16 | 125 |
| 18 | 115 |
| 20 | 106 |

In some embodiments, the capacitor 100 of FIGS. 7A-7C can be configured as or similar to a Class 2 capacitor. For example, the capacitor 100 can be implemented as an X5R and/or X7R capacitor (e.g., with 1.5*Vr at maximum rated temperature for 1,000 hours). Such a capacitor can be configured to have a human body model (HBM) electrostatic discharge (ESD) target voltage that is at least 1,200V, and preferably greater than 2,000V.

In some embodiments, the capacitor 100 of FIGS. 7A-7C can be configured as or similar to a Class 1 capacitor. For example, the capacitor 100 can be implemented as a COG capacitor (e.g., with 2.0*Vr at 125° C. for 1,000 hours). Such a capacitor can be configured to have a human body model (HBM) electrostatic discharge (ESD) target voltage that is at least 1,200V, and preferably greater than 2,000V.

Figure 8A:
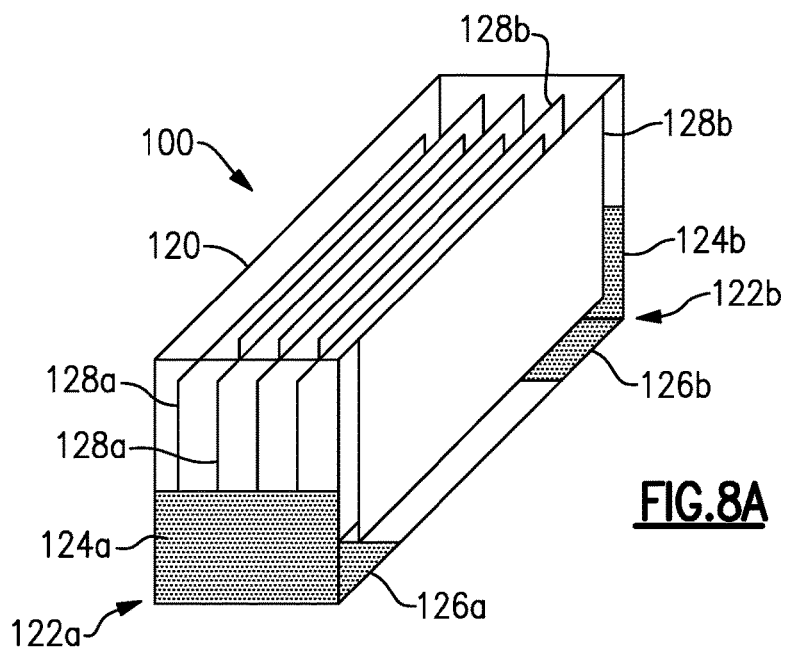
FIGS. 8A-8E show various views of a capacitor implemented as an SMT device, in which a plurality of parallel plates are arranged to be approximately perpendicular to the horizontal plane.
Figure 8B:
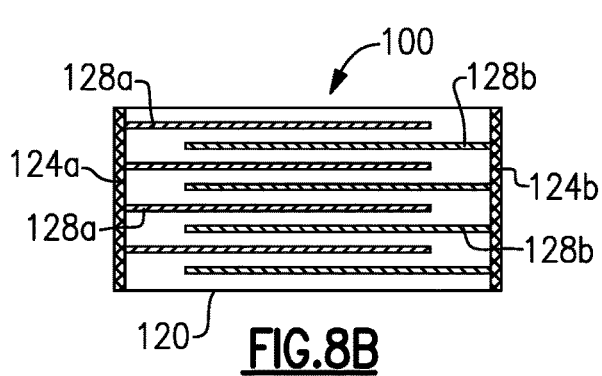
Figure 8C:
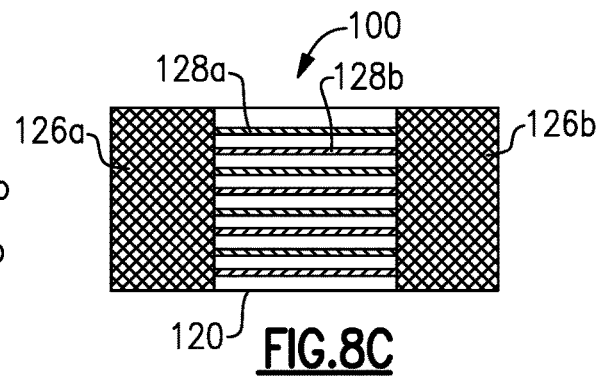
Figure 8D:
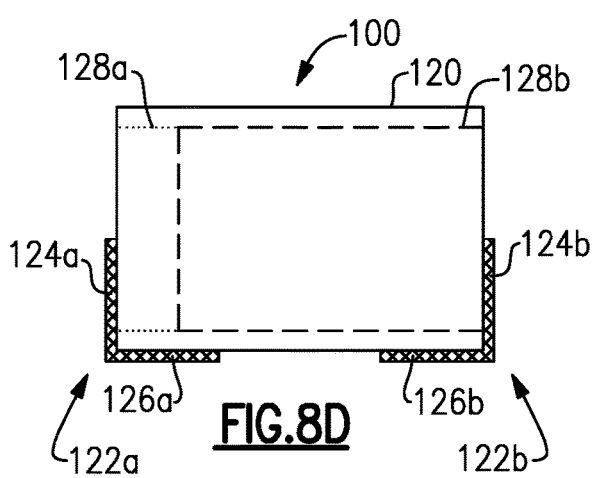
Figure 8E:
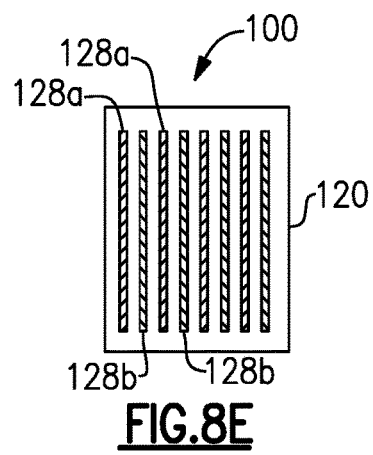

FIGS. 8A-8E show various views of a capacitor implemented as an SMT device 100, in which a plurality of parallel plates are arranged to be approximately perpendicular to the horizontal plane (e.g., similar to the example of FIG. 5). FIG. 8A shows a perspective view, FIGS. 8B and 8C show upper and lower plan views, and FIGS. 8D and 8E show side sectional views.

The capacitor 100 of FIGS. 8A-8E is shown to include a first set of conductive layers 128a interleaved with a second set of conductive layers 128b so as to form an interleaved-plate capacitor configuration. The first set of conductive layers 128a are shown to be implemented within a body 120 of the capacitor 100 and electrically connected to a first conductive wall 124a (e.g., on the left side when viewed as in FIGS. 8B and 8D). Similarly, the second set of conductive layers 128b are shown to be implemented within the body 120 of the capacitor 100 and electrically connected to a second conductive wall 124b (e.g., on the right side when viewed as in FIGS. 8B and 8D). Although described in the context of the interleaved configuration having alternating layers (e.g., first conductive layer, second conductive layer, first conductive layer, etc.), it will be understood that the first and second sets of conductive layers can be arranged in other manners. For example, alternating groups of two first conductive layers and two second conductive layers can be implemented. In another example, one or more dummy or floating conductive layers can be provided between first and second conductive layers.

In the example of FIGS. 8A-8E, the first conductive wall 128a is shown to be electrically connected to a first terminal 126a on a lower surface of the body 120. Similarly, the second conductive wall 128b is shown to be electrically connected to a second terminal 126b on a lower surface of the body 120. In such a configuration, the capacitor 100 is shown to have L-shaped terminations (e.g., when viewed as in FIGS. 8A and 8D). Examples related to such L-shaped terminations are described herein in greater detail.

In the example of FIGS. 8A-8E, the first and second sets of conductive layers 128a, 128b can be formed on a plurality of respective substrate layers. Such formation of conductive layers can be achieved by, for example, printing or other patterning/deposition techniques. In some embodiments, such conductive layers can be formed on the respective substrate layers in an array format (e.g., in a panel), and once the overall layer structure is obtained, individual units can be obtained by, for example, singulation. In some embodiments, the terminals 126a, 126b can be formed while in the panel format, after singulation, or in any combination thereof. In some embodiments, the first and second conductive walls 124a, 124b can be formed after the singulation process.

In the example of FIGS. 8A-8E, the capacitor 100 can implemented as an SMT device having a reduced footprint size and an increased height as described herein. For example, the capacitor 100 can be implemented in a sub-01005 SMT package size having approximate dimensions of L=250±13 µm, W=125±13 µm, and T=210±10 µm. The first and second terminals 126a, 126b on the lower side can be dimensioned such that their inward edges are separated from each other by a distance of approximately 120 µm or greater. The vertical dimension of the first and second conductive walls 124a, 124b can be approximately 75 µm or greater. The lateral dimension (along W) of the first and second conductive walls 124a, 124b and the first and second terminals 126a, 126b can be approximately 115±15 µm.

As described herein, the increased height of the capacitor 100 can provide increased flexibility in design. For example, the increased height can allow the capacitor 100 of FIGS. 8A-8E to be implemented with larger inner electrodes (128a, 128b) (e.g., approximately 175 µm×200 µm vs. 90 µm×200 µm). Such larger electrodes can be formed by, for example, printing; and the larger size of the electrodes can allow higher printing yields. For example, the foregoing inner electrodes can have the example dimension of 200 µm after singulation, but can be printed (before singulation) at slightly more than double the dimension (e.g., 400 to 420 µm). Such double-dimension printed conductor can be for two neighboring capacitors. Accordingly, the 200 µm dimension can result when the two neighboring capacitors are singulated so as to cut the approximately double-dimensioned print. For a given conductor, such a singulation process can expose the corresponding edges of the printed conductors to allow electrical connection to a termination assembly (e.g., adhesion during a termination sintering process).

In the example of FIGS. 8A-8E, the capacitor 100 is depicted as having the L-shaped terminations. In some embodiments, terminations similar to the example of FIGS. 7A-7C can be provided so as to allow mounting of the capacitor 100 upright or inverted. In the context of the L-shaped termination, such a configuration can allow the body 120 to be taller and longer (along the length dimension), thereby allowing even larger dimensions for the inner electrodes (128a, 128b). For example, the body 120 can be approximately 10 µm taller and approximately 20 µm longer than that of a similar configuration without the L-shaped termination. It will be understood that the example capacitor 100 of FIGS. 8A-8E can have other termination configurations. For example, L-shaped termination can be implemented on the upper portion of the body 120. In another example, a wrap-around termination similar to the example of FIGS. 7A-7C can be implemented.

Figure 9:
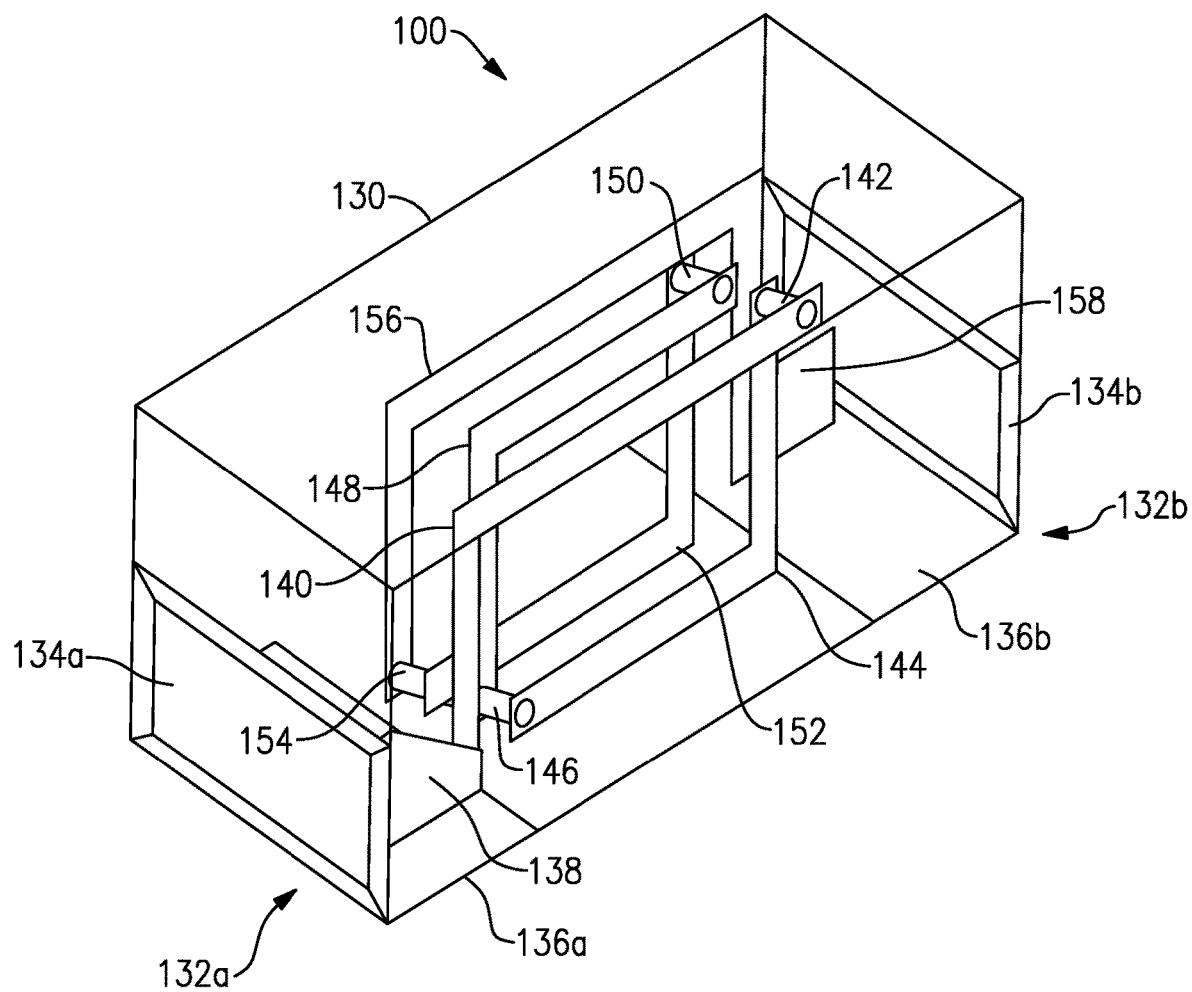
FIG. 9 shows an example of an inductor implemented as an SMT device, in which a plurality of conductive features formed on their respective planes can be electrically connected so as to form a winding.

FIG. 9 shows an example of an inductor implemented as an SMT device 100, in which a plurality of conductive features (e.g., conductive traces) formed on their respective planes (which are arranged to be approximately perpendicular to the horizontal plane (e.g., similar to the example of FIG. 5)) are electrically connected so as to form a winding. For example, a first end of the winding is shown to begin at a conductive feature 138 which is electrically connected to a first conductive wall 134a. The conductive feature 138 is also shown to be electrically connected to a conductive trace 140 having two segments arranged in an L-shape, such that one end of the L-shape is electrically connected to the conductive feature 138. The conductive feature 138 and the conductive trace 140 can be formed on a common layer. The other end of the L-shape of the conductive trace 140 is shown to be electrically connected to another L-shaped conductive trace 144 (which can be formed on its corresponding layer) through a conductive via 142, such that the conductive traces 140, 144 generally form one full turn.

The example winding is shown to continue, with a third L-shaped conductive trace 148 (which can be formed on its corresponding layer) being electrically connected to the second L-shaped conductive trace 144 through a conductive via 146. Similarly, a fourth L-shaped conductive trace 152 (which can be formed on its corresponding layer) is shown to be electrically connected to the third L-shaped conductive trace 148 through a conductive via 150.

The last example conductive trace 156 (which can be formed on its corresponding layer) is shown to have a U-shape, with its first end electrically connect to the fourth L-shaped conductive trace 152 through a conductive via 154. The second end of the U-shaped conductive trace 156 is shown to be electrically connected to a conductive feature 158 which is in turn electrically connected to a second conductive wall 134b. The conductive feature 158 and the U-shaped conductive trace 156 can be formed on a common layer.

Configured in the foregoing manner, the first conductive wall 134a is electrically connected to the second conductive wall 134b through the example winding so as to provide inductance functionality. The first conductive wall 134a is shown to be electrically connected to a first bottom conductive layer 136a so as to form a first L-shaped terminal 132a. Similarly, the second conductive wall 134b is shown to be electrically connected to a second bottom conductive layer 136b so as to form a second L-shaped terminal 132b. It will be understood that the example inductor 100 of FIG. 9 can have other termination configurations. For example, a land grid array (LGA) termination can be utilized, in which termination features are implemented on the mounting surface of the body 130.

In some embodiments, an inductor can be implemented as an SMT device 100 in a manner similar to the example of FIG. 9, but with a plurality of conductive features (e.g., conductive traces) formed on their respective planes which are arranged to be approximately parallel to the horizontal plane (e.g., similar to the example of FIG. 4). In such an inductor, an increased height dimension of the inductor can allow one or more of the following features to be implemented: (1) more turns of conductive traces can be formed, thereby allowing a higher inductance range; (2) thicker conductive traces can be formed, thereby allowing higher current handling capability and higher Q values; and (3) greater separation of the winding from termination and ground for higher Q values. Termination for such an inductor can include L-shaped terminals, or terminals similar to the example of FIGS. 7A-7C.

In the example of FIG. 9 in which the conductive traces are approximately perpendicular to the horizontal plane, the increased height of the inductor 100 can provide increased flexibility in design. For example, the increased height can allow the inductor 100 of FIG. 9 to be implemented with larger loop diameter in the turns of the winding to thereby provide higher Q values.

For the foregoing inductors having L-shaped terminals, such a termination configuration can allow the body (e.g., 130 in FIG. 9) of the inductor to be taller and longer (along the length dimension), thereby allowing even larger dimensions for the conductive traces. For example, the body 130 can be approximately 10 µm taller and approximately 20 µm longer than that of a similar configuration without the L-shaped termination. Such L-shaped terminations can allow implementation of larger diameter loops, and result in less parasitic capacitance to the inductor winding.

In the example of FIG. 9 and the example in which the conductive traces are approximately parallel to the horizontal plane, the inductor 100 can implemented as an SMT device having a reduced footprint size and an increased height as described herein. For example, the inductor 100 can be implemented in a sub-01005 SMT package size having approximate dimensions of L=250±13 μm, W=125±13 μm, and T=210±10 μm. The first and second terminals 136a, 136b on the lower side can be dimensioned such that their inward edges are separated from each other by a distance of approximately 120 μm or greater. The vertical dimension of the first and second conductive walls 134a, 134b can be approximately 75 μm or greater. The lateral dimension (along W) of the first and second conductive walls 134a, 134b and the first and second terminals 136a, 136b can be approximately 115±15 μm.

In the example of FIG. 9 and the example in which the conductive traces are approximately parallel to the horizontal plane, the inductor 100 can be configured to meet certain electrical requirements. For example, such an inductor can be configured to pass a maximum rated current at 125° C. for 1,000 hours. In another example, such an inductor can be configured to have a human body model (HBM) electrostatic discharge (ESD) target voltage that is at least 1,200V, and preferably greater than 2,000V. In yet another example, such an inductor can be configured to have a Q value that is greater than a selected value at 1 GHz for inductance values that are less than or equal to 10 nH. In some embodiments, such a selected value of Q can be, for example, 8, 9, 10, 11, 12, 13, 14, 15, 16, 17 or 18.

Figure 10:
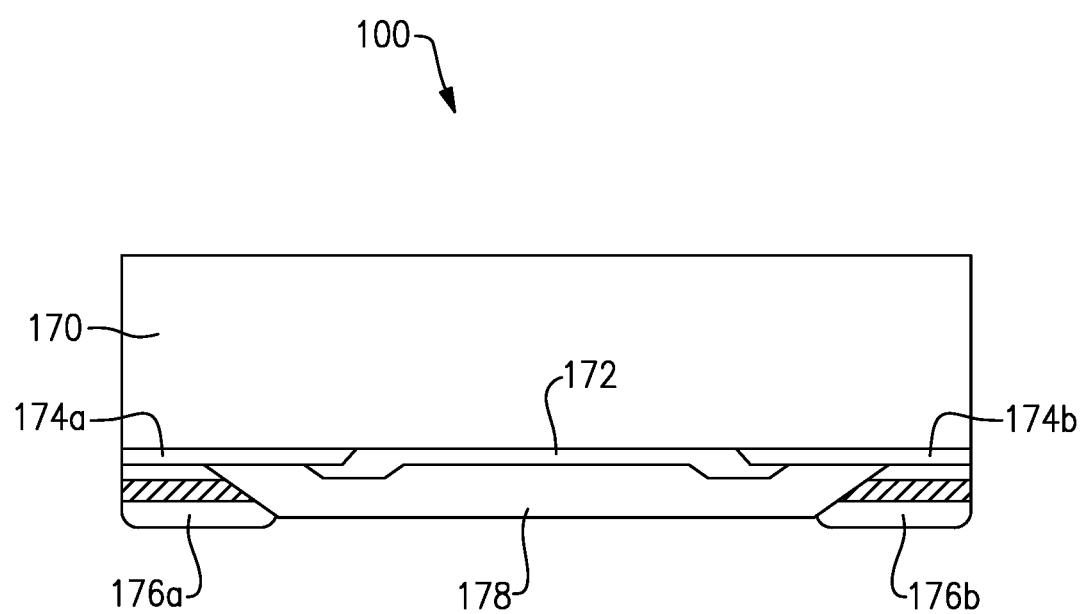
FIG. 10 shows an example of a resistor implemented as an SMT device.

FIG. 10 shows an example of a resistor 100 implemented as an SMT device. The example resistor 100 is shown to include a body 170 and a resistive element 172 implemented on the lower side of the body 170. The resistive element 172 can be configured to provide a desired resistance between first and second terminals 176a, 176b which are electrically connected to respective ends of the resistive element 172 through first and second conductive features 174a, 174b. In some embodiments, the space between the terminals (176a, 176b) and the resistive element 172 can be partially or fully filled with an insulator material 178 to, for example, substantially cover the resistive element 172 and the conductive features 174a, 174b.

In the resistor 100 of FIG. 10, an increased height dimension of the resistor 100 can allow a wider range in the thickness of the body 170. For example, in embodiments where an array of such resistors are processed together in a panel format, having a thicker body (e.g., approximately 125 μm instead of 90 μm) can increase the yield of singulated resistor. Such an increase in yield can result from, for example, reduced likelihood of panel breakage during various stages of fabrication, and improved quality of singulation.

In the example of FIG. 10, the resistor 100 can implemented as an SMT device having a reduced footprint size and an increased height as described herein. For example, the resistor 100 can be implemented in a sub-01005 SMT package size having approximate dimensions of L=250±13 μm and W=125±13 μm. The overall thickness T can be greater than 125 μm. The first and second terminals 176a, 176b on the lower side can be dimensioned such that their inward edges are separated from each other by a distance of approximately 120 μm or greater.

In the example of FIG. 10, the resistor 100 can be configured to meet certain electrical requirements. For example, such a resistor can be configured to have a minimum working voltage of 25V, minimum wattage of 0.025 W, and TCR (temperature coefficient of resistance) that is less than 300 ppm. Such requirements can also include passing a 25% power rating at 125° C. for 1,000 hours. Such a resistor can be configured to have a human body model (HBM) electrostatic discharge (ESD) target voltage that is at least 1,200V, and preferably greater than 2,000V.

In some embodiments, an SMT device (e.g., a capacitor, an inductor, or a resistor) having one or more features as described herein can be implemented as a box (also referred to herein as a rectangular cuboid) shaped device having a length L, a width W, and a height T. The length L can have a value of $L_0 \pm \Delta L$; and $L_0$ can be approximately 250 μm, and $\Delta L$ can be less than or equal to 20% of $L_0$, less than or equal to 15% of $L_0$, less than or equal to 14% of $L_0$, less than or equal to 13% of $L_0$, less than or equal to 12% of $L_0$, less than or equal to 11% of $L_0$, less than or equal to 10% of $L_0$, less than or equal to 9% of $L_0$, less than or equal to 8% of $L_0$, less than or equal to 7% of $L_0$, less than or equal to 6% of $L_0$, less than or equal to 5% of $L_0$, less than or equal to 4% of $L_0$, less than or equal to 3% of $L_0$, less than or equal to 2% of $L_0$, or less than or equal to 1% of $L_0$. The width W can have a value of $W_0 \pm \Delta W$; and $W_0$ can be approximately 125 μm, and $\Delta W$ can be less than or equal to 20% of $W_0$, less than or equal to 15% of $W_0$, less than or equal to 14% of $L_0$, less than or equal to 13% of $W_0$, less than or equal to 12% of $W_0$, less than or equal to 11% of $W_0$, less than or equal to 10% of $W_0$, less than or equal to 9% of $W_0$, less than or equal to 8% of $W_0$, less than or equal to 7% of $W_0$, less than or equal to 6% of $W_0$, less than or equal to 5% of $W_0$, less than or equal to 4% of $W_0$, less than or equal to 3% of $W_0$, less than or equal to 2% of $W_0$, or less than or equal to 1% of $W_0$. The height T can have a value that is greater than the value of 1.0×W, greater than the value of 1.1×W, greater than the value of 1.2×W, greater than the value of 1.3×W, greater than the value of 1.4×W, greater than the value of 1.5×W, greater than the value of 1.6×W, greater than the value of 1.7×W, greater than the value of 1.8×W, greater than the value of 1.9×W, or greater than the value of 2.0×W. The dimensions L×W×T can include any combination of the foregoing example values of L, W and T.

As described herein, a module such as a radio-frequency (RF) module can include a number of SMT devices. Having some or all of such SMT devices configured as described herein can allow such a module to benefit from a significant reduction in its lateral dimensions. As also described herein, such reduced-sized SMT devices can be configured so as to provide desired performance.

Figure 11:
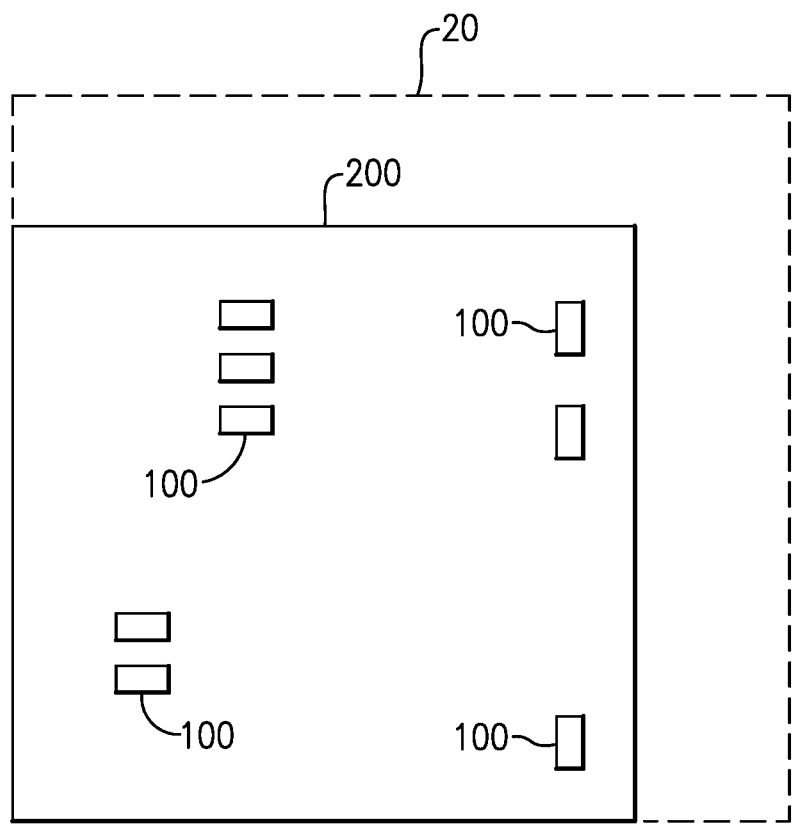
FIG. 11 depicts a reduction in lateral dimensions that can be realized by a radio-frequency (RF) module having a number of reduced-sized SMT devices having one or more features as described herein.

FIG. 11 depicts a reduction in lateral dimensions that can be realized by an RF module 200 having a number of reduced-sized SMT devices 100 having one or more features as described herein. Such an RF module is compared to an RF module 20 that does not have the reduced-sized SMT devices.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 12:
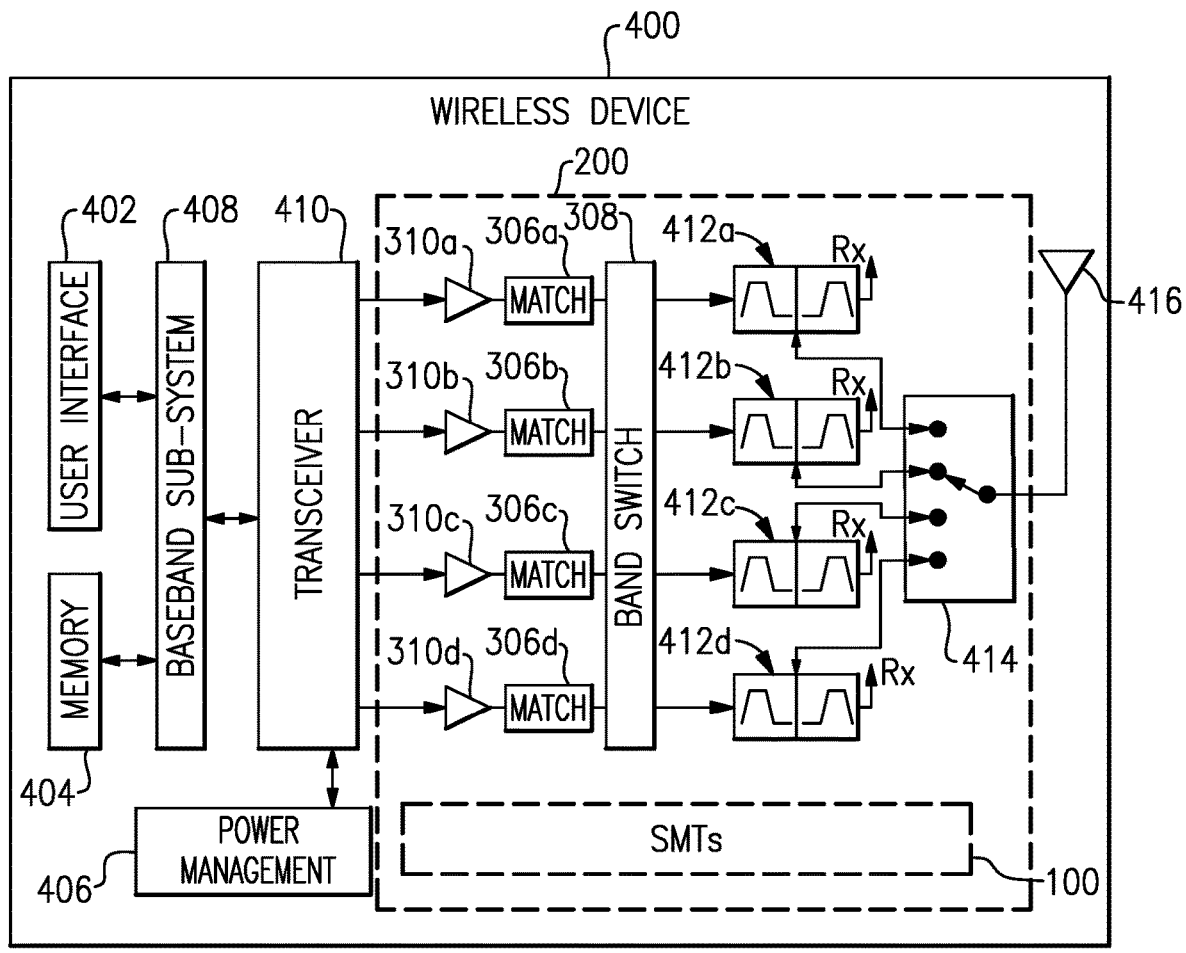
FIG. 12 schematically depicts an example wireless device having one or more advantageous features described herein.

FIG. 12 depicts an example wireless device 400 having one or more advantageous features described herein. In the context of a module having one or more features as described herein, such a module can be generally depicted by a dashed box 200, and can be implemented as a front-end module (FEM) such as a FEM-including-duplexer (FEMiD). As shown in FIG. 12, such a module can include a number of SMT devices (collectively indicated as 100) having one or more features as described herein. It will be understood that such an FEM can include more or less components than shown in the example of FIG. 12. It will also be understood that a module other than an FEM can include one or more features as described herein, and be implemented in the wireless device 400.

PAs 310 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 200.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 310 are shown to be matched (via respective match circuits 306) and routed to an antenna 416 through a band selection switch 308, their respective duplexers 412 and an antenna switch 414. In some embodiments, each duplexer 412 can allow transmit and receive operations to be performed simultaneously using a common antenna (e.g., 416). In FIG. 12, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Although various examples are described herein in the context of RF applications, it will be understood that SMT devices having one or more features as described herein can also be configured for and utilized in other electronic applications.

In some examples described herein, a winding having a plurality of conductive traces connected by conductive vias is sometimes referred to as having a diameter. It will be understood that such a diameter does not necessarily imply that the winding has a sectional shape that is circular. The winding can have a sectional shape that is circular (e.g., by having curved conductive traces), rectangular (e.g., by having L and/or U shaped conductive traces as shown in some of the examples herein), or any other shape. In the context of a non-circular sectional shape of the winding, it will be understood that a "diameter" can refer to an appropriate dimension. For example, if a sectional shape is a square, a "diameter" can refer to a distance between opposing sides of the square. In another example, if a sectional shape is a non-square rectangle, a "diameter" can refer to a distance between opposing length sides of the rectangle, a distance between opposing width sides of the rectangle, or any combination thereof. In situations where comparisons are made between an SMT device having one or more features as described herein and a conventional SMT device, it will be understood that "diameters" can refer to corresponding dimensions among the two SMT devices.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A surface-mount device comprising:
an electrical element including a capacitance element or an inductance element;
a body configured to support the electrical element and having a rectangular cuboid shape with a length, a width, and a height that is greater than the width, the body including a base plane configured to allow mounting of the surface-mount device; and
first and second terminals implemented on the base plane and connected to the electrical element to be capable of providing electrical connections between the electrical element and a packaging substrate or a circuit board when the surface-mount device is mounted thereon.

2. A packaged module comprising:

a packaging substrate; and a surface-mount device that includes an electrical element having a capacitance element or an inductance element, and a body configured to support the electrical element and having a rectangular cuboid shape with a length, a width, and a height that is greater than the width, the body including a base plane configured to allow mounting of the surface-mount device, the surface-mount device further including first and second terminals implemented on the base plane and connected to the electrical element to provide electrical connections between the electrical element and the packaging substrate.

3. A circuit board assembly comprising:

a circuit board; and a surface-mount device that includes an electrical element having a capacitance element or an inductance element, and a body configured to support the electrical element and having a rectangular cuboid shape with a length, a width, and a height that is greater than the width, the body including a base plane configured to allow mounting of the surface-mount device, the surface-mount device further including first and second terminals implemented on the base plane and connected to the electrical element to provide electrical connections between the electrical element and the circuit board.

* * * * *